(12) United States Patent
Nishitani

(10) Patent No.: US 10,263,172 B2
(45) Date of Patent: Apr. 16, 2019

(54) PIEZOELECTRIC BODY, VIBRATION WAVE MOTOR AND ELECTRONIC APPARATUS

(71) Applicant: CANON KABUSHIKI KAISHA, Tokyo (JP)

(72) Inventor: Hitoshi Nishitani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 452 days.

(21) Appl. No.: 15/165,204

(22) Filed: May 26, 2016

(65) Prior Publication Data

US 2016/0352258 A1    Dec. 1, 2016

(30) Foreign Application Priority Data

May 29, 2015 (JP) ................................. 2015-110748

(51) Int. Cl.
| | |
|---|---|
| H01L 41/04 | (2006.01) |
| H01L 41/047 | (2006.01) |
| G02B 7/10 | (2006.01) |
| H02N 2/00 | (2006.01) |
| H02N 2/02 | (2006.01) |

(52) U.S. Cl.
CPC ............ H01L 41/0475 (2013.01); G02B 7/10 (2013.01); H02N 2/0085 (2013.01); H02N 2/026 (2013.01)

(58) Field of Classification Search
CPC .... H01L 41/0475; G02B 7/10; H02N 2/0085; H02N 2/026
USPC ........................................................ 310/366
See application file for complete search history.

(56) References Cited

U.S. PATENT DOCUMENTS

2016/0127623 A1* 5/2016 Shimada ................. G02B 7/10
348/360

FOREIGN PATENT DOCUMENTS

| CN | 1108971 A | 9/1995 |
|---|---|---|
| CN | 101674029 A | 3/2010 |
| CN | 102244191 A | 11/2011 |
| CN | 105340096 A | 2/2016 |

(Continued)

OTHER PUBLICATIONS

The above foreign patent documents were cited in a Jul. 3, 2018 Chinese Office Action, which is enclosed with an English Translation, that issued in Chinese Patent Application No. 201610353982.1.

(Continued)

*Primary Examiner* — Thomas Dougherty
(74) *Attorney, Agent, or Firm* — Cowan, Liebowitz & Latman, P.C.

(57) ABSTRACT

To improve both of the mechanical reliability and electrical reliability of an electronic apparatus including a piezoelectric body, a vibrator, and a vibration wave motor. The piezoelectric body is configured by bonding a piezoelectric element and a flexible printed circuit substrate FPC, a coverlay has an end N made up of a first outline part and a second outline part that intersect with wiring layers, the first outline part coming in contact with an electrode F1 of electrodes F, and the second outline part coming in contact with another electrode of the electrodes F. Length L1 from an outer-shape line M of the piezoelectric element that intersects with the FPC to the first outline part is shorter than length L2 from the outer-shape line M to the second outline part, and the electrode F1 is located closer to the outer-shape line than the other electrode of the electrodes F.

9 Claims, 9 Drawing Sheets

(56) References Cited

FOREIGN PATENT DOCUMENTS

| | | |
|---|---|---|
| DE | 69416989 T2 | 8/1999 |
| JP | 11-191974 A | 7/1999 |
| JP | 2003-125589 A | 4/2003 |
| JP | 2007-330036 A | 12/2007 |
| JP | 2012-016107 A | 1/2012 |
| JP | 2014-017909 A | 1/2014 |
| JP | 2015-006047 A | 1/2015 |
| WO | 2009/001753 A1 | 12/2008 |

OTHER PUBLICATIONS

The above foreign patent documents were cited in the Feb. 28, 2019 Japanese Office Action, which is enclosed without an English Translation, that issued in Japanese Patent Application No. 2015110748.

* cited by examiner

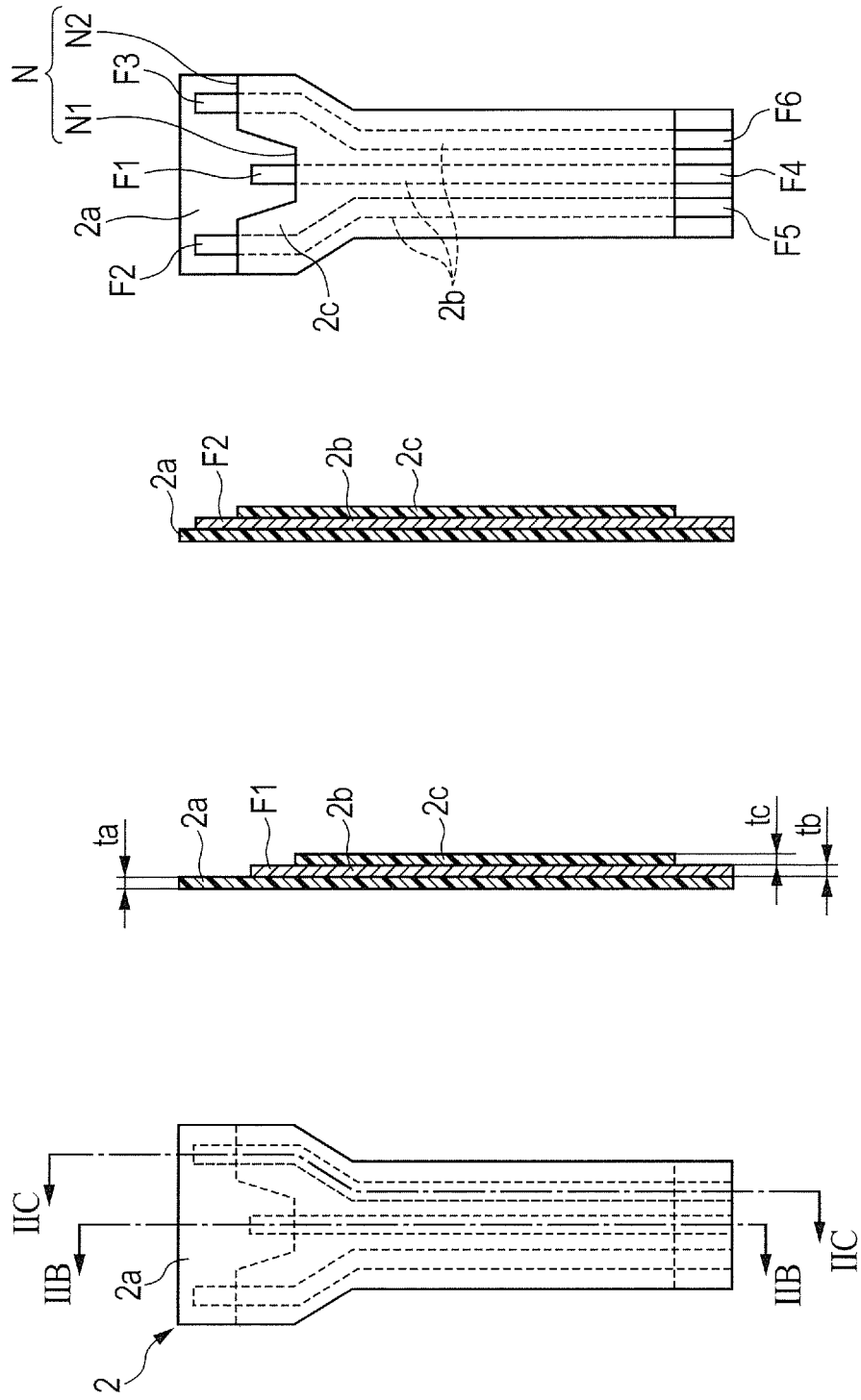

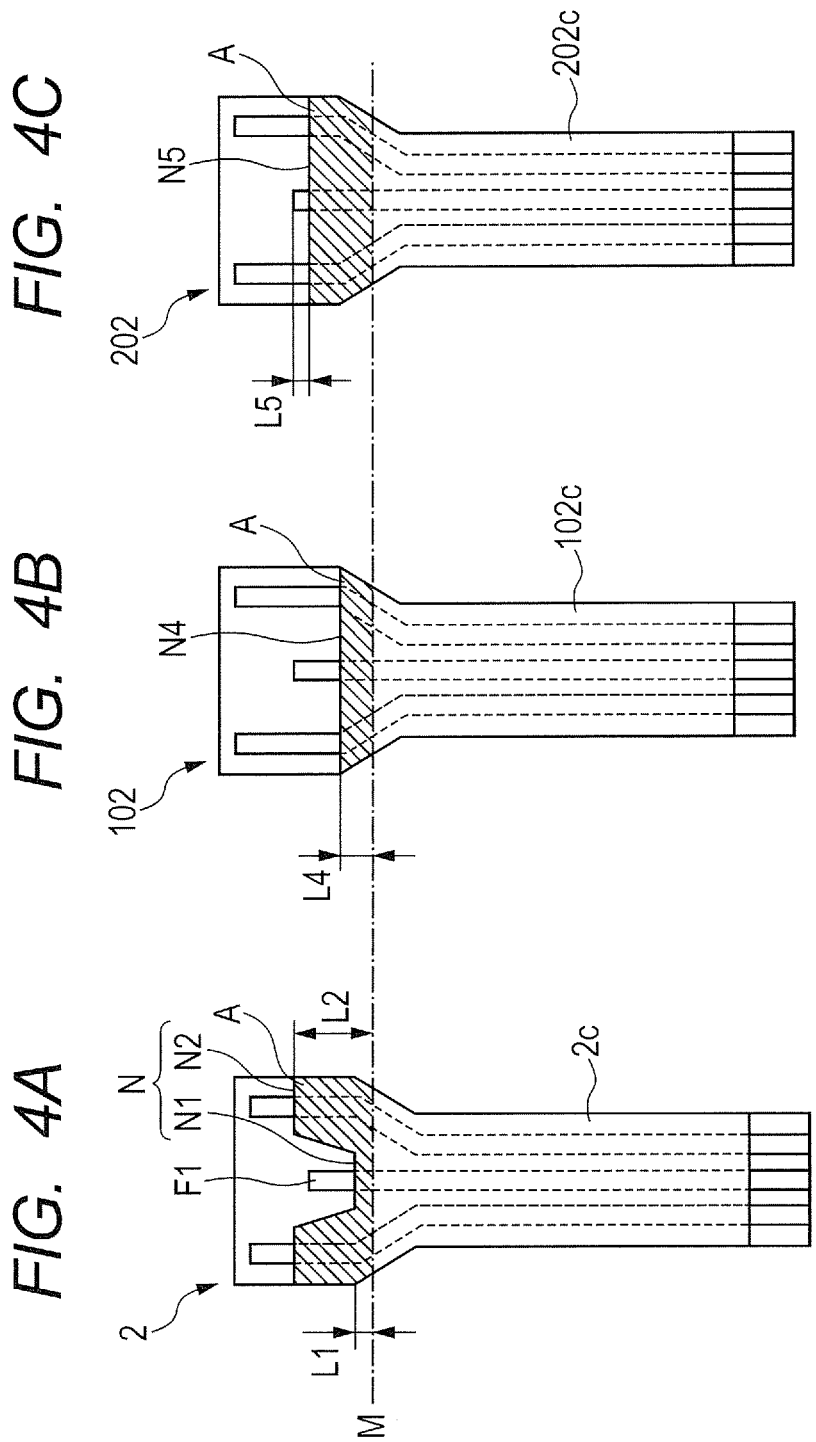

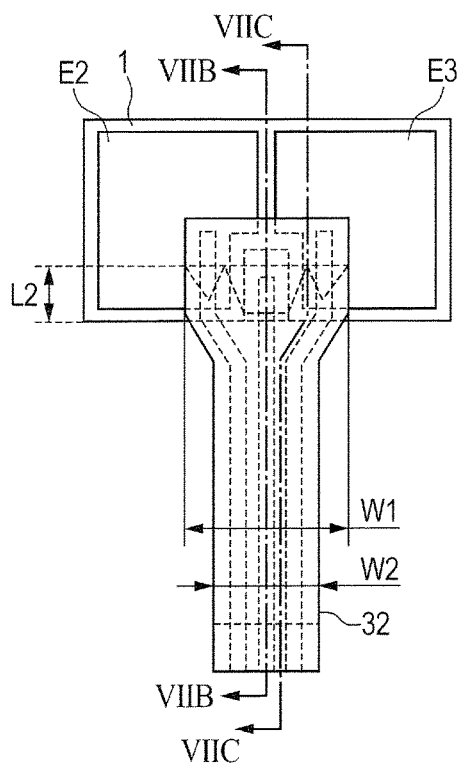
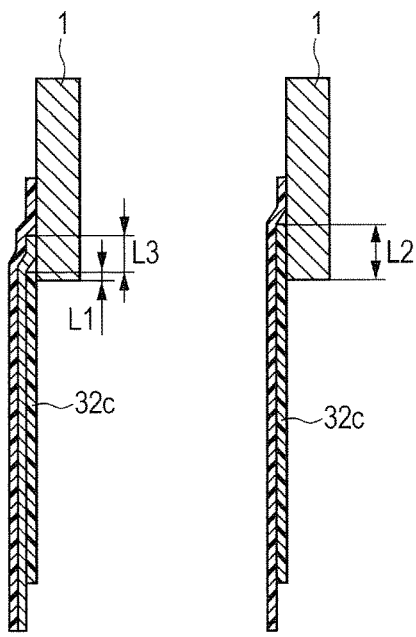
FIG. 7A  FIG. 7B  FIG. 7C
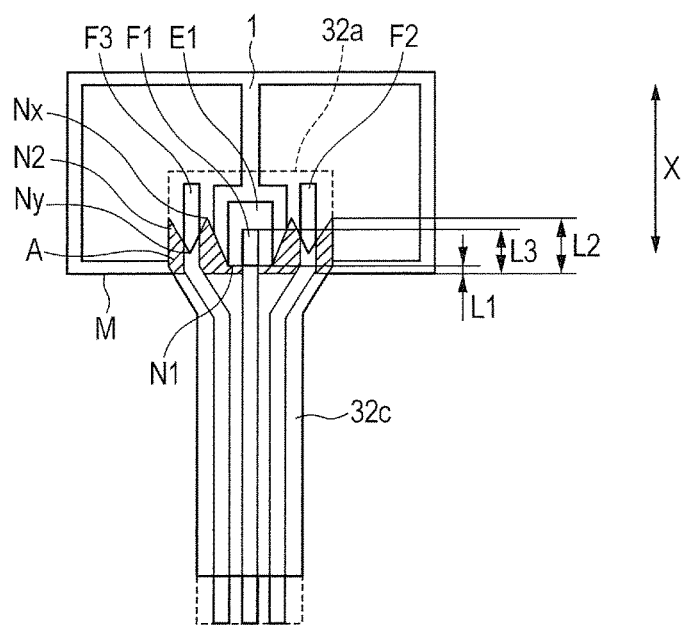
FIG. 7D

PIEZOELECTRIC BODY, VIBRATION WAVE MOTOR AND ELECTRONIC APPARATUS

BACKGROUND OF THE INVENTION

Field of the Invention

The present invention relates to a piezoelectric body including a piezoelectric element and a substrate for power feeding.

Description of the Related Art

Conventionally ultrasonic motors have been used for a lens barrel of an imaging apparatus or the like due to their features of being compact and light-weighted and driving speedily and silently. Such an ultrasonic motor typically includes a piezoelectric body as its source of vibration, and Japanese Patent Application Laid-Open No. 2012-16107 and Japanese Patent Application Laid-Open No. 2015-6047 disclose such an example. Hereinafter a piezoelectric element, to which a flexible printed circuit substrate (abbreviated as FPC) as power-feeding means is bonded, is called a piezoelectric body, a piezoelectric body, to which an elastic body is bonded, is called a vibrator, and a motor including a vibrator as its driving source is called a vibration wave motor.

In order to ensure the reliability of an electronic apparatus including a piezoelectric body, a vibrator, and a vibration wave motor (hereinafter they are abbreviated as "a piezoelectric body or the like"), the bonding part between the piezoelectric element and the FPC has to have sufficient mechanical reliability and electrical reliability. Herein, the mechanical reliability refers to strength and durability against breaks and peeling, whereas the electrical reliability refers to certainty in electrical connection and stability of electrical resistance. In order to allow an electronic apparatus including a piezoelectric body or the like to operate in harsh conditions and severe environment as compared with a current state, both of the mechanical reliability and electrical reliability have to be improved.

SUMMARY OF THE INVENTION

In view of this, the present invention aims to improve both of the mechanical reliability and electrical reliability of an electronic apparatus including a piezoelectric body or the like.

To fulfil the aim, a piezoelectric body, a vibrator, and a vibration wave motor of the present invention are configured by bonding a piezoelectric element and a FPC. A coverlay has an end made up of a first outline part and a second outline part that intersect with wiring layers, the first outline part coming in contact with an electrode F1 of electrodes F, and the second outline part coming in contact with another electrode of the electrodes F. Length L1 from an outer-shape line of the piezoelectric element that intersects with the flexible printed circuit substrate to the first outline part is shorter than length L2 from the outer-shape line M to the second outline part, and the electrode F1 is located closer to the outer-shape line than the other electrode of the electrodes F.

According to the present invention, both of the mechanical reliability and electrical reliability of an electronic apparatus including a piezoelectric body or the like can be improved.

Further features of the present invention will become apparent from the following description of exemplary embodiments with reference to the attached drawings.

BRIEF DESCRIPTION OF THE DRAWINGS

FIGS. 2A, 2B, 2C and 2D each show the configuration of a FPC 2 according to the first embodiment.

FIGS. 4A, 4B and 4C each show a comparative example to explain the advantageous effects of the first embodiment.

FIGS. 7A, 7B, 7C and 7D each show the configuration of a piezoelectric body according to a third embodiment.

DESCRIPTION OF THE EMBODIMENTS

Preferred embodiments of the present invention will now be described in detail in accordance with the accompanying drawings.

First Embodiment

Figure 1A:
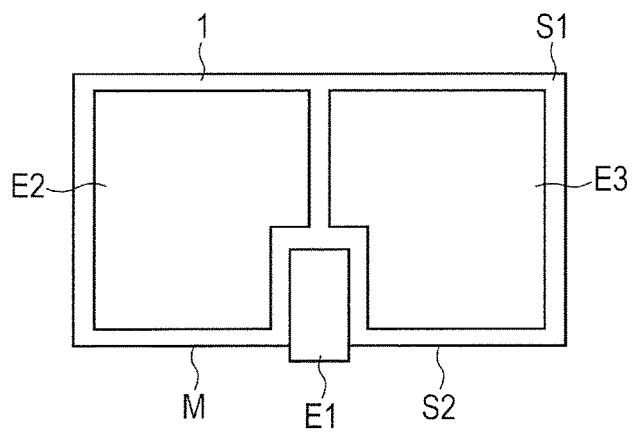
FIGS. 1A, 1B, 1C and 1D each show the configuration of a piezoelectric element 1 according to a first embodiment.
Figure 1B:
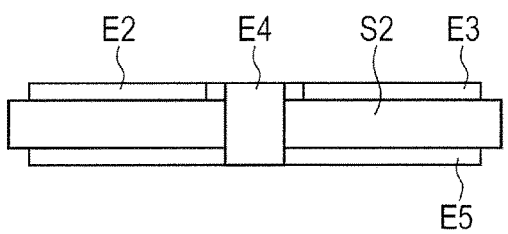
Figure 1C:
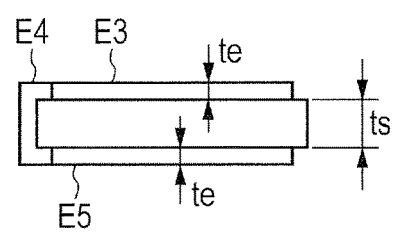
Figure 1D:
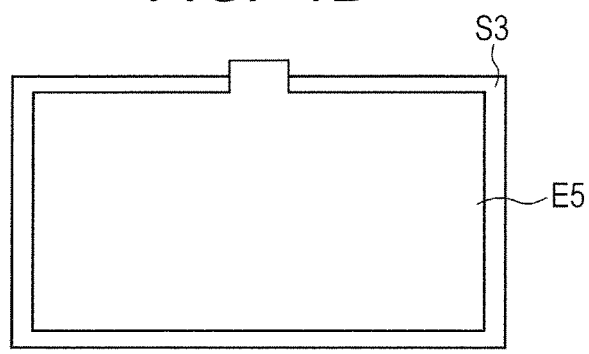

The configuration of a piezoelectric element 1 according to a first embodiment of the present invention is firstly described. FIG. 1A is a plan view, FIG. 1B is a front view, FIG. 1C is a right lateral view, and FIG. 1D is a bottom view. The piezoelectric element 1 includes a plurality of electrodes E (electrodes E1 to E5) at a part thereof. In the present embodiment, the electrodes E1 to E3 are formed on the surface S1 of the piezoelectric element 1, the electrode E4 is formed at a part of a wall face S2 of the piezoelectric element 1, and the electrode E5 is formed on the rear face S3 of the piezoelectric element 1. The number of the electrodes E may be changed in another embodiment. The piezoelectric element 1 is subjected to polarization treatment by applying high voltage between the electrode E2, the electrode E3 and the electrode E5. FIG. 1C shows thickness ts of the piezoelectric element 1 and thickness te of the electrodes E. These thicknesses ts and te are shown exaggeratingly, and actually the thickness ts of the piezoelectric element 1 is a few hundreds of μm and the thickness te of the electrodes E is a few μm.

The piezoelectric element 1 has the outer-shape line M of the piezoelectric element 1 that intersects with a FPC 2 described later. Then the electrode E1 of the present embodiment is located the closest to the outer-shape line M of the piezoelectric element 1, and this electrode E1 is electrically connected to the electrode E5 on the rear face S3 of the piezoelectric element 1 via the electrode E4 of the wall face S2. In this way, since the electrode E1 and the electrode E5 are electrically connected, when AC voltage is applied between the electrodes E1 and E2 and between the electrodes E1 and E3, then ultrasonic vibrations will be obtained from the piezoelectric effect of the piezoelectric element 1 as described in Japanese Patent Application Laid-Open No.

2012-16107 and Japanese Patent Application Laid-Open No. 2015-6047. Although the present embodiment is configured as stated above so that the electrode E1 is electrically connected to the electrode E5 on the rear face S3 of the piezoelectric element 1 via the electrode E4 of the wall face S2, they may be connected via a through hole in another embodiment.

Next the configuration of the FPC 2 according to the first embodiment of the present invention is described. FIG. 2A is a plan view, FIG. 2B is a cross-sectional view taken along the line IIB-IIB, FIG. 2C is a cross-sectional view taken along the line IIC-IIC, and FIG. 2D is a bottom view. To the FPC 2, a coverlay 2c is attached so as to cover a part of a plurality of wiring layers 2b that extend over a base 2a, and a plurality of electrodes F (electrodes F1 to F6) are formed at a part of the wiring layers 2b that is not covered with the coverlay 2c. In FIGS. 2B and 2C, thickness to of the base 2a, thickness tb of the wiring layers 2b, and thickness tc of the coverlay 2c are shown exaggeratingly, and actually they are about a dozen to a few tens of μm.

As shown in FIG. 2D, the electrode F1 and the electrode F4, the electrode F2 and the electrode F5, and the electrode F3 and the electrode F6 are electrically connected via their respective wiring layers 2b, and the electrodes F4 to F6 are inserted into a connector not illustrated, whereby electricity is supplied to the electrodes F1 to F3. The electrodes F1 to F3 are electrically connected to the plurality of electrodes E of the piezoelectric element 1. Then, the coverlay 2c has an end N in the longitudinal direction, at which a first outline part N1 and a second outline part N2 are formed so as to intersect with the wiring layers 2b. That is, in the present embodiment, the end N of the coverlay 2c is not parallel to the end of the base 2a in the longitudinal direction. Then, the first outline part N1 comes in contact with the electrode F1 and the second outline part N2 comes in contact with the electrode F2 and the electrode F3. The end N of the coverlay 2c in the longitudinal direction may have a shape parallel to the end of the base 2a in the longitudinal direction, depending on the shape of the end of the base 2a in the longitudinal direction.

In the present embodiment, six electrodes F of the electrodes F1 to F6 are formed in the FPC 2, and the number of the electrodes F may be changed in another embodiment. The wiring layers 2b are made of rolled copper foil, and the base 2a and the coverlay 2c are made of polyimide, and these materials may be changed in another embodiment.

Figure 3A:
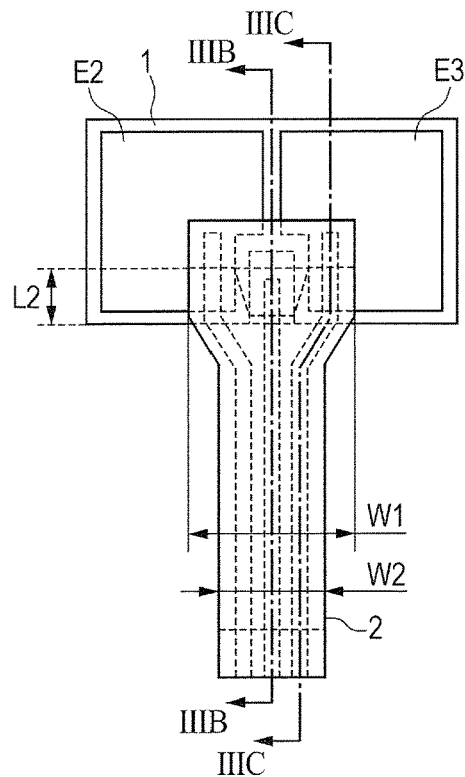
FIGS. 3A, 3B, 3C and 3D each show the configuration of a piezoelectric body according to the first embodiment.
Figure 3B:
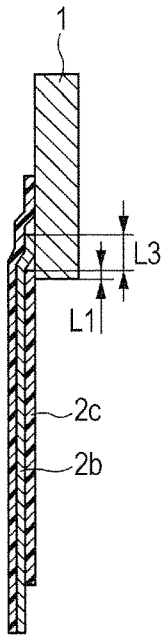
Figure 3C:
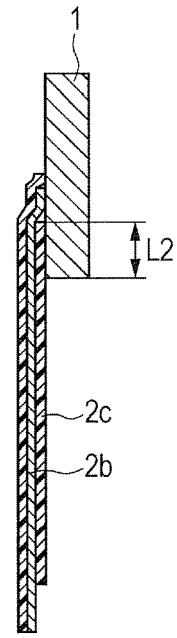
Figure 3D:
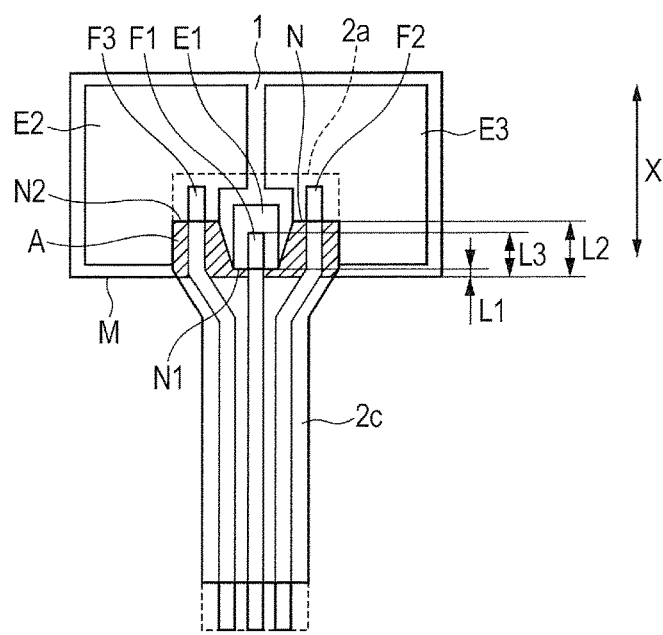

Next, the configuration of a piezoelectric body configured by bonding the piezoelectric element 1 and the FPC 2 is described. FIG. 3A is a plan view of the piezoelectric body, FIG. 3B is a cross-sectional view taken along the line IIIB-IIIB, FIG. 3C is a cross-sectional view taken along the line IIIC-IIIC, and FIG. 3D is a plan view of the piezoelectric body of FIG. 3A, which is a plan view omitting the base 2a of the FPC 2 for easy understanding. Since the piezoelectric body is configured by bonding the plane of the piezoelectric element 1 shown in FIG. 1A and the bottom face of the FPC 2 shown in FIG. 2D, FIG. 3A shows the plane of the piezoelectric element 1 shown in FIG. 1A and the plane of the FPC 2 shown in FIG. 2A. Since the thickness of the electrodes E1 to E5 is very thin compared with the thickness of the piezoelectric element 1, the electrodes E1 to E5 are omitted in FIGS. 3B and 3C, and the thicknesses of the piezoelectric element 1 and the FPC 2 are shown exaggeratingly.

FIG. 3B shows the length L3 along which the electrode F1 of the FPC 2 is bonded to the electrode E1 of the piezoelectric element 1. An increase in this length L3 means an increase in bonding area where the electrode F1 is bonded to the electrode E1, which therefore can lead to improvement in electrical reliability of the bonding part of the electrode F1. FIG. 3C shows the maximum length L2 along which the coverlay 2c is bonded on the piezoelectric element 1 in the extending direction of the coverlay 2c. An increase in this length L2 means an increase in bonding area where the rigid coverlay 2c is bonded, which therefore can lead to improvement in mechanical reliability of the bonding part of the coverlay 2c.

FIG. 3D shows the region A with diagonal lines where the coverlay 2c overlaps with the piezoelectric element 1. The electrode F1 of the plurality of electrodes F is located the closest to the outer-shape line M of the piezoelectric element 1, and the other electrodes F2 and F3 of the electrodes F are located further from the outer-shape line M of the piezoelectric element 1 than the electrode F1. Then, the piezoelectric body of the present embodiment has a feature that the length L1 from the outer-shape line M of the piezoelectric element 1 that intersects with the FPC 2 to the first outline part N1 is shorter than the length L2 (X direction in the drawing) from the outer-shape line M to the second outline part N2. This results from the end N of the coverlay 2c having a shape that is not parallel to the outer-shape line M of the piezoelectric element 1.

As shown in FIG. 3A, the piezoelectric body of the present embodiment is configured so that, for the dimensions of the width direction that is orthogonal to the extending direction of the FPC 2, the dimension W1 of the region A where the piezoelectric element 1 and the FPC 2 overlap is larger than the dimension W2 where the piezoelectric element 1 and the FPC 2 do not overlap. This is to improve the mechanical reliability at the bonding part of the piezoelectric element 1 and the FPC 2 by making the dimension W1 larger, while downsizing a part of the FPC 2 that is routed by making the dimension W2 smaller.

Next, the advantageous effects of the present embodiment are described. FIGS. 4A to 4C are bottom views of the FPC, in which the position of the outer-shape line M of the piezoelectric element 1 is indicated by the dot-and-dash line. The region A where the coverlay 2c overlaps with the piezoelectric element 1 is indicated with diagonal lines. FIG. 4A shows the FPC 2 of the present embodiment, and FIGS. 4B and 4C show a FPC 102 and a FPC 202, respectively, as comparative examples. The FPC 102 and the FPC 202 have their coverlays 102c and 202c whose ends N4 and N5 are both parallel to the outer-shape line M of the piezoelectric element 1.

As shown in FIG. 4B, the coverlay 102c has the end N4 that is parallel to the outer-shape line M of the piezoelectric element 1, and the end N4 is close to the outer-shape line M of the piezoelectric element 1, i.e., the region A is narrow. In such a case, since the length L4 of the region A in the longitudinal direction of the FPC 102 is short, meaning that the bonding area of the rigid coverlay 102c and the piezoelectric element 1 is small, the mechanical reliability of the bonding part deteriorates. As shown in FIG. 4C, the coverlay 202c has the end N5 that is parallel to the outer-shape line M of the piezoelectric element 1, and the end N5 is far from the outer-shape line M of the piezoelectric element 1, i.e., the region A is wide. In such a case, although the length of the region A in the longitudinal direction of the FPC 202 is longer, the length L5 where the electrode F1 is exposed is shorter, meaning that the bonding area of the electrode E1 of the piezoelectric element 1 and the electrode F1 of the FPC 202 is smaller, and so the electrical reliability of the bonding part deteriorates.

On the contrary, as shown in FIG. 4A, the end N of the coverlay 2c has the first outline part N1 and the second outline part N2 that intersect with the wiring layers 2b, and the first outline part N1 comes in contact with the electrode F1 of the electrodes F and the second outline part N2 comes in contact with the other electrodes F2 and F3 of the electrodes F. Then, the length L1 from the outer-shape line M of the piezoelectric element 1 that intersects with the FPC 2 to the first outline part N1 is shorter than the length L2 from the outer-shape line M to the second outline part N2. Therefore, the piezoelectric body of the present embodiment allows the bonding area of the electrode E1 of the piezoelectric element 1 and the electrode F1 of the FPC 2 to be increased, which leads to the effect of improving the electrical reliability at the bonding part of the electrode F1. The bonding area of the rigid coverlay 2c and the piezoelectric element 1 also can be increased, which leads to the effect of improving the mechanical reliability at the bonding part of the coverlay 2c.

Figure 5A:
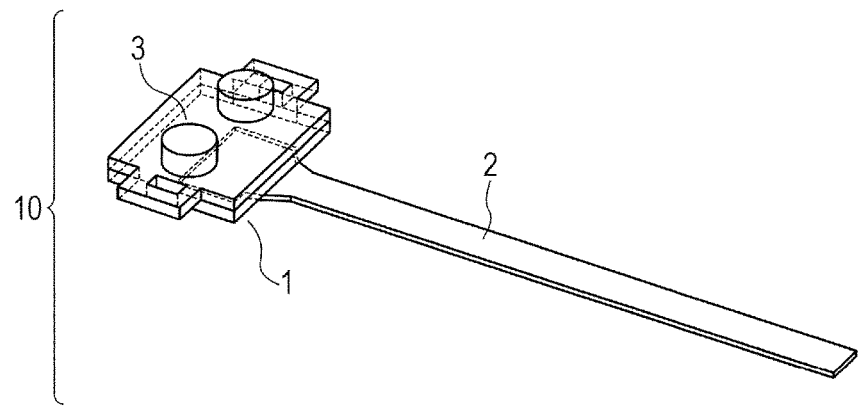
FIGS. 5A and 5B are perspective views showing a vibrator 10 and a vibration wave motor including the piezoelectric body according to the first embodiment, respectively.
Figure 5B:
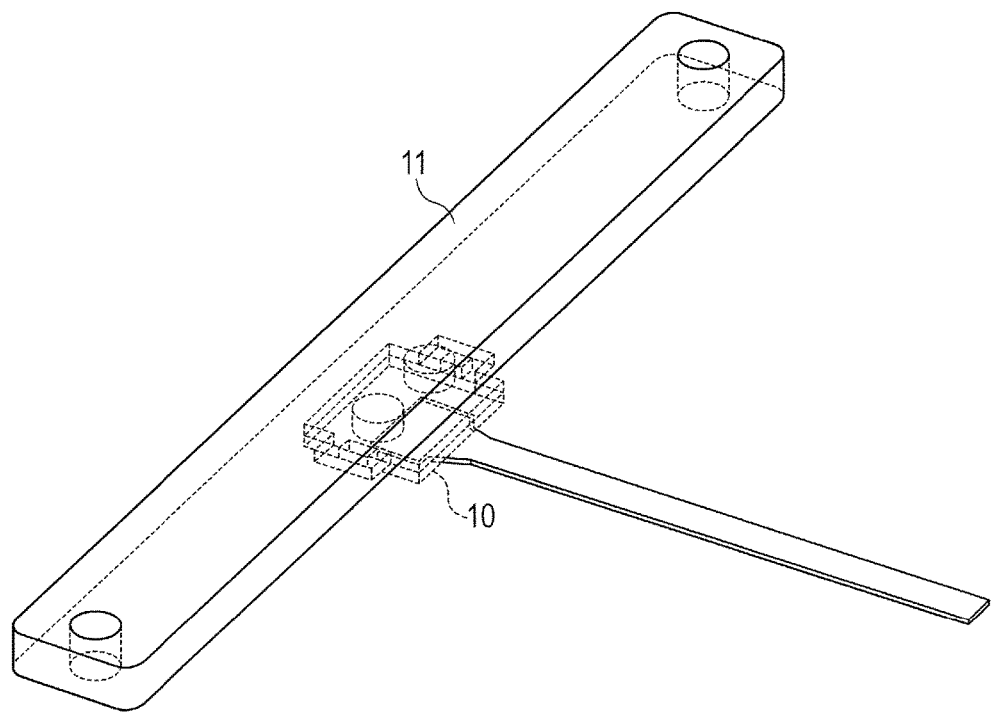

FIG. 5A is a perspective view of a vibrator 10 that is configured by attaching an elastic body 3 to the piezoelectric body of the present embodiment, and FIG. 5B is a perspective view of a vibration wave motor (ultrasonic motor) configured by arranging a friction member 11 so as to be opposed to the vibrator 10. The operation of these vibrator 10 and vibration wave motor is as described in Japanese Patent Application Laid-Open No. 2012-16107 and Japanese Patent Application Laid-Open No. 2015-6047. Since the piezoelectric body of the present embodiment has the features as stated above, the electronic apparatus including such a piezoelectric body or the like can have both of the improved mechanical reliability and electrical reliability.

Second Embodiment

Next, the configuration of a piezoelectric body according to the second embodiment of the present invention, which is configured by bonding a piezoelectric element 1 and a FPC 22, is described. The forms shown in FIGS. 6A to 6D are similar to those shown in FIGS. 3A to 3D, respectively. The second embodiment is different from the first embodiment in that, in the cross section taken along the line VIB-VIB of FIG. 6A, a coverlay 22c does not overlap with the piezoelectric element 1. Further, two regions A where the coverlay 22c overlaps with the piezoelectric element 1 are present on the piezoelectric element 1.

Figure 6A:
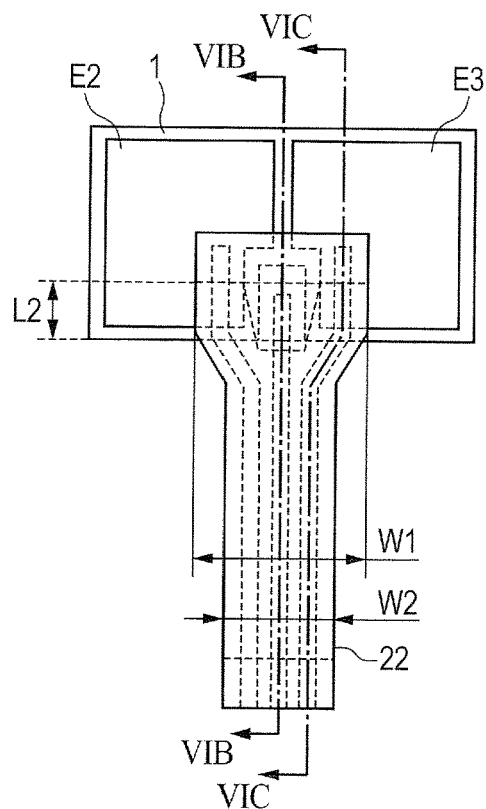
FIGS. 6A, 6B, 6C and 6D each show the configuration of a piezoelectric body according to a second embodiment.
Figure 6B:
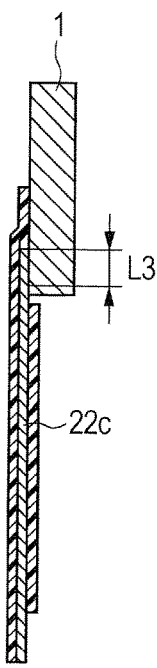
Figure 6C:
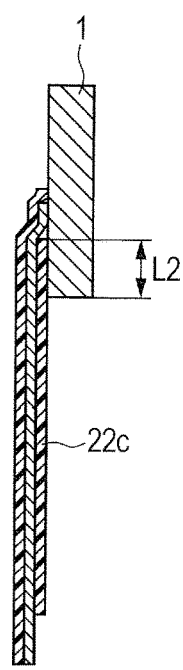
Figure 6D:
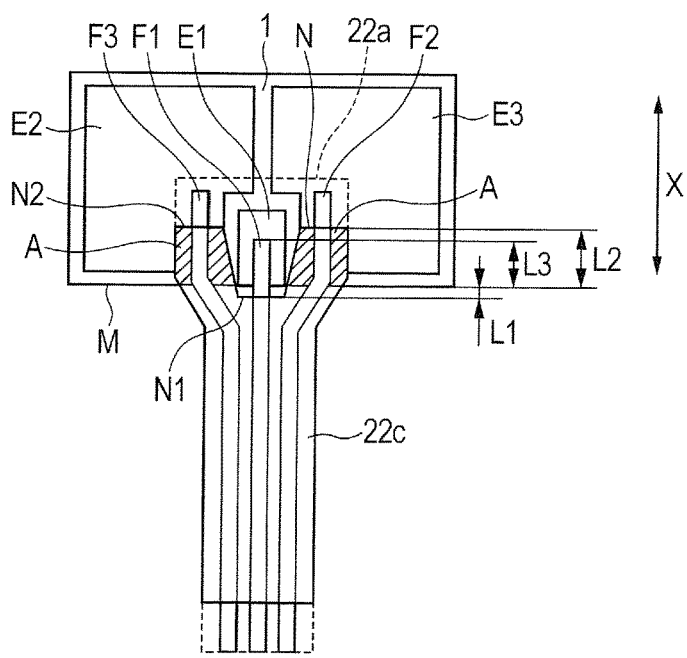

FIG. 6D shows the two regions A with diagonal lines, where the coverlay 22c overlaps with the piezoelectric element 1. The electrode F1 of the plurality of electrodes F is located the closest to the outer-shape line M of the piezoelectric element 1, and the other electrodes F2 and F3 of the electrodes F are located further from the outer-shape line M of the piezoelectric element 1 than the electrode F1. Then, the piezoelectric body of the second embodiment has a feature that the length L1 from the outer-shape line M of the piezoelectric element 1 that intersects with the FPC 22 to the first outline part N1 is shorter than the length L2 (X direction in the drawing) from the outer-shape line M to the second outline part N2. This includes the case where this length L1 is 0.

Due to the feature of the present embodiment as stated above, the bonding area of the electrode E1 of the piezoelectric element 1 and the electrode F1 of the FPC 22 can be increased, which leads to the effect of improving the electrical reliability at the bonding part of the electrode F1. The bonding area of the rigid coverlay 22c and the piezoelectric element 1 also can be increased, which leads to the effect of improving the mechanical reliability at the bonding part of the coverlay 22c. Further, since the piezoelectric body of the present embodiment is configured so that the coverlay 22c does not overlap with the piezoelectric element 1 in the cross section along the line VIB-VIB, this can suppress inhibition of vibrations of the piezoelectric element 1 by the bonding of the coverlay 22c.

As described above, the piezoelectric body of the present embodiment has the feature as stated above, and can improve both of the mechanical reliability and the electrical reliability of an electronic apparatus including such a piezoelectric body. Similarly to the first embodiment, the present embodiment also may have other forms as stated in the first embodiment, may have the feature to downsize the part where the FPC 22 is routed, and may be used for the vibrator 10 or the vibration wave motor.

Third Embodiment

Next, the configuration of a piezoelectric body according to the third embodiment of the present invention, which is configured by bonding a piezoelectric element 1 and a FPC 32, is described. The forms shown in FIGS. 7A to 7D are similar to those shown in FIGS. 3A to 3D, respectively. FIG. 7C is a cross-sectional view taken along the line VIIC-VIIC at a part between a wiring layer 2b and another wiring layer 2b in FIG. 7A. The third embodiment is different from the first embodiment in that, as shown in FIGS. 7A and 7D, a coverlay 32c has an end N including a second outline part N2 that has an outline dented toward the outer-shape line M. Such a dented outline defines a convex Nx and a concave Ny. In the region A, this convex Nx corresponds to a part where the wiring layer 2b is not present, and the concave Ny corresponds to a part where the wiring layer 2b is present.

FIG. 7D shows the region A with diagonal lines, where the coverlay 32c overlaps with the piezoelectric element 1. The electrode F1 of the plurality of electrodes F is located the closest to the outer-shape line M of the piezoelectric element 1, and the other electrodes F2 and F3 of the electrodes F are located further from the outer-shape line M of the piezoelectric element 1 than the electrode F1. Then, the piezoelectric body of the present embodiment has a feature that the length L1 from the outer-shape line M of the piezoelectric element 1 that intersects with the FPC 32 to the first outline part N1 is shorter than the length L2 (X direction in the drawing) from the outer-shape line M to the second outline part N2. This feature is the same as that of the first embodiment. Further, the second outline part N2 has an outline part dented toward the outer-shape line M.

Since the length L2 of the piezoelectric body of the present embodiment is longer than the length L1 thereof, it has an advantageous effect of improving the mechanical reliability and the electrical reliability at the bonding part of the electrode F1 similarly to the first embodiment. The piezoelectric body of the present embodiment enables a larger bonding area at the electrode F2 and the electrode F3 due to the concave Ny, and so has another advantageous effect of improving the electrical reliability more in addition to the effect of the first embodiment.

As described above, the piezoelectric body of the present embodiment has the feature as stated above, and can improve both of the mechanical reliability and the electrical reliability of an electronic apparatus including such a piezoelectric body. Similarly to the first embodiment, the present embodiment also may have other forms as stated in the first embodiment, may have the feature to downsize the part where the FPC 32 is routed, and may be used for the vibrator 10 or the vibration wave motor.

Figure 8A:
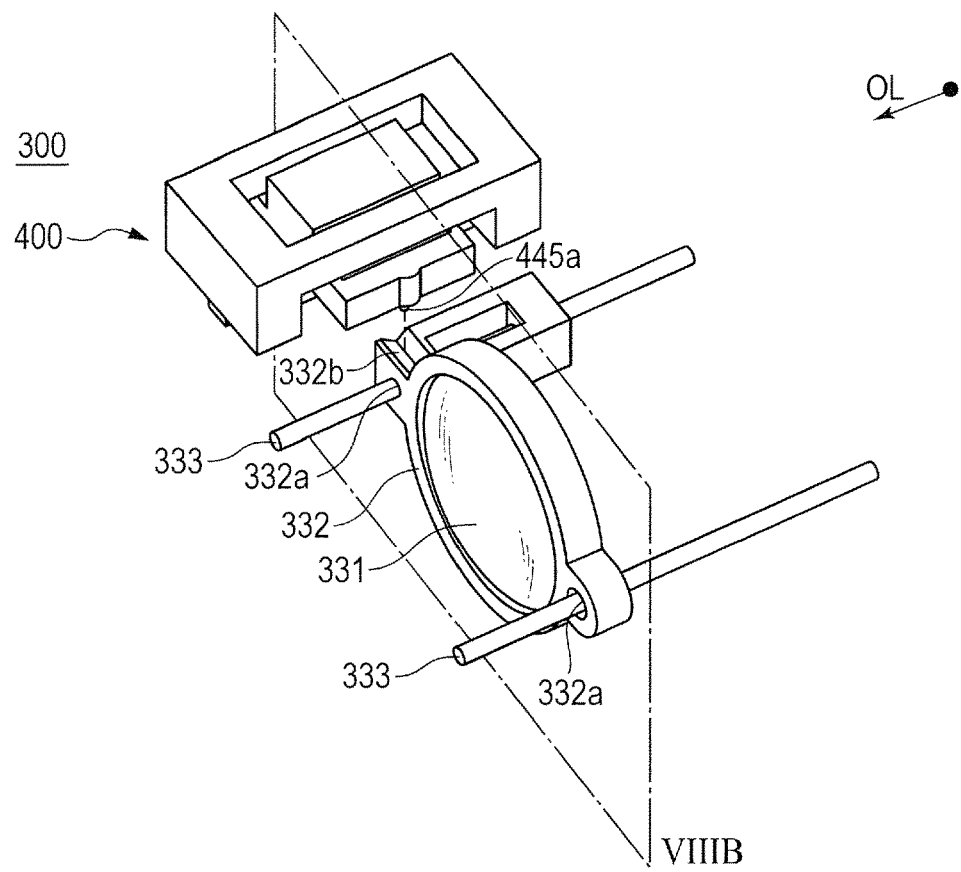
FIGS. 8A and 8B show the overall configuration of a lens-driving device 300 including a vibration wave motor 400.
Figure 8B:
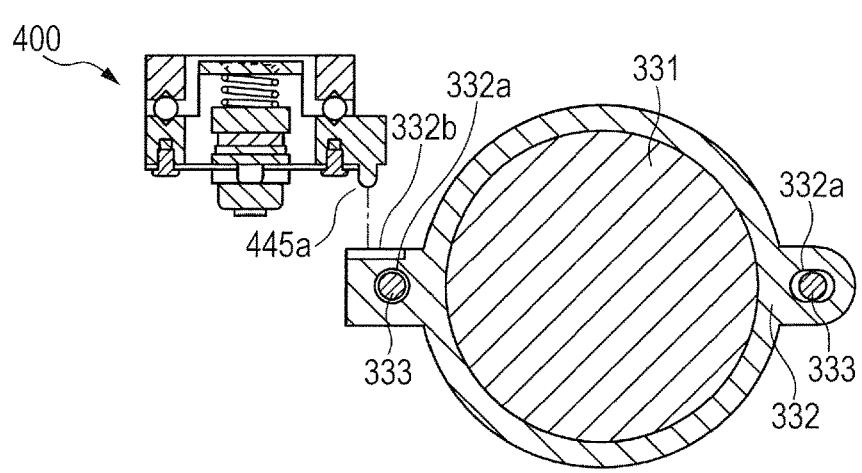
Figure 9A:
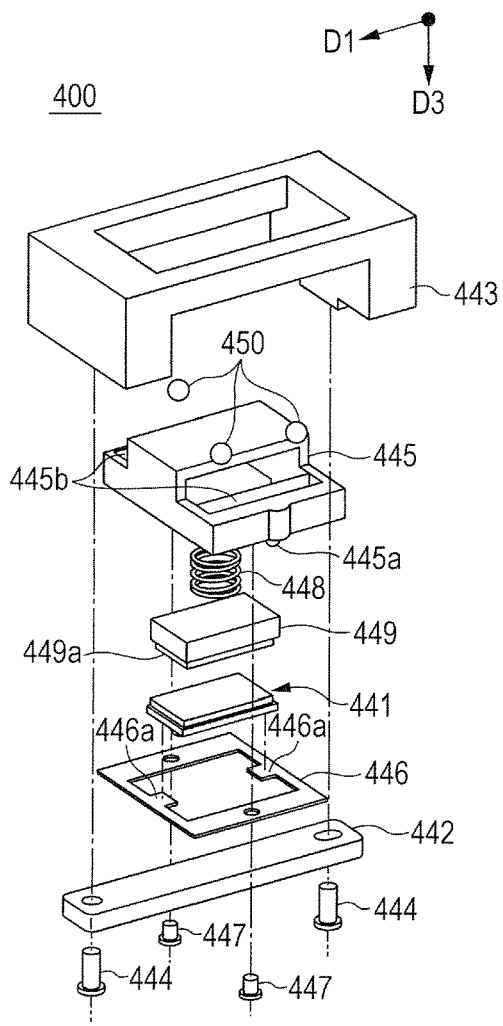
FIGS. 9A and 9B are exploded perspective views of the vibration wave motor 400.
Figure 9B:
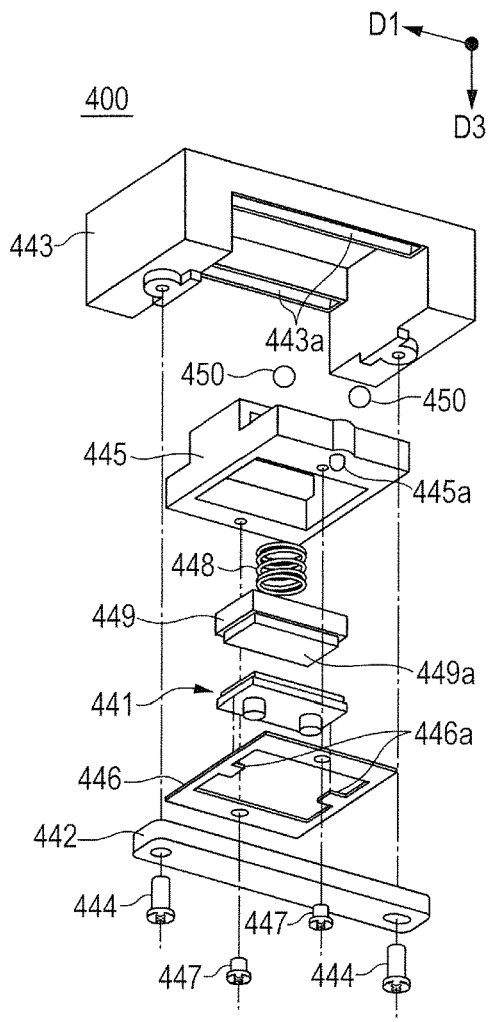
Figure 10:
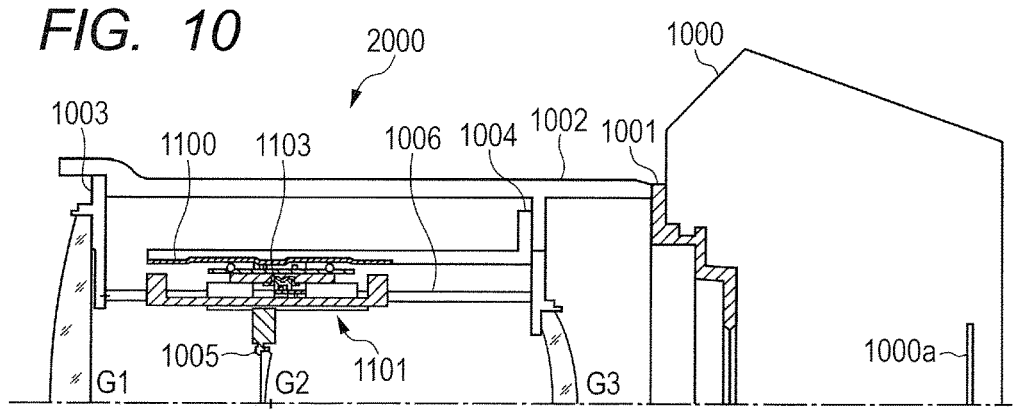
FIG. 10 shows an electronic apparatus (a lens barrel) including the lens-driving device 300 made up of the vibration wave motor 400.

The piezoelectric body of each embodiment as described above can improve both of the mechanical reliability and the electrical reliability of an electronic apparatus including such a piezoelectric body, and can be used for a lens-driving device 300 to drive a lens in an imaging apparatus and a lens barrel. FIGS. 8A and 8B show the overall configuration of the lens-driving device 300 including a vibration wave motor 400 made up of the piezoelectric body of each embodiment. FIGS. 9A and 9B are an exploded perspective view of the vibration wave motor 400. FIG. 10 shows a lens barrel including the lens-driving device 300 made up of the vibration wave motor 400.

FIG. 8A is a perspective view of the lens-driving device 300, and FIG. 8B is a cross-sectional view taken along the plane VIIIB of the lens-driving device 300 in FIG. 8A. The lens-driving device 300 includes a lens 331, a lens holder 332, two guide bars 333, and a vibration wave motor 400. The lens 331 is a focus lens that is used for a camera barrel, for example, which can change the focal length of light flux incident from the optical axis direction OL by traveling forward and backward in the optical direction of the lens (direction OL in FIG. 8A). The lens holder 332 holds the lens 331, and has holes 332a, through each of which the guide bar 333 passes through, and a groove 332b that joins with a driving force transmission part 445a provided at the vibration wave motor 400. The two guide bars 333 extend in the optical axis direction OL of the lens 331 and pass through the holes 332a of the lens holder 332, so as to guide the lens holder 332 to be movable in the optical axis direction OL only.

The vibration wave motor 400 includes a piezoelectric body stated in each of the above embodiments. The vibration wave motor 400 further has a convex-shaped driving force transmission part 445a to transmit a driving force of the motor, and the driving force transmission part 445a and the groove 332b are engaged and joined. When the vibration wave motor 400 operates for driving, the joining of the driving force transmission part 445a and the groove 332b transmits the driving force to the lens holder 332, so that the lens holder 332 and the lens 331 can move in the optical axis direction OL. Note here that the mechanism to transmit the driving force of the vibration wave motor 400 to the lens holder 332 and the mechanism to move the lens holder 332 and the lens 331 in the optical axis direction OL are not limited to the mechanisms shown in FIG. 8A, which may be other mechanisms.

FIGS. 9A and 9B are exploded perspective views of the vibration wave motor 400 to describe the configuration of the vibration wave motor 400. FIG. 9A is an exploded perspective view from the obliquely above, and FIG. 9B is an exploded perspective view from the obliquely below. The vibration wave motor 400 includes a vibrator 441, a friction member 442, a holding member 443, a fastening member 444, a vibrator holding member 445, a vibrator joining member 446, a fixing member 447 to fix the vibrator joining member 446, a pressurizing member 448, a pressurizing plate 449, and a rolling ball 450. The vibrator 441 is similar to the vibrator 10 as stated above, and FIGS. 9A and 9B omit the FPC 2.

The vibrator holding member 445 holds the vibrator 441, and moves the friction member 442 while being integrated with the vibrator 441. The vibrator holding member has the driving force transmission part 445a to transmit the driving force of the vibrator 441 to the outside and a groove 445b at which the rolling ball 450 is disposed. The vibrator joining member 446 is made up of a thin-plate like metal plate, for example. Since it is a thin-plate like metal plate, it is deformed easily in the direction to pressurize the vibrator 441 to the friction member 442 (direction D3 in FIG. 9A), but is less deformed in the driving direction of the vibration wave motor 400 (direction D1 in FIG. 9A). The vibrator joining member 446 has a coupling part 446a that is coupled with the vibrator 441. The coupling part 446a is coupled with the vibrator 441 by bonding or welding, for example. The vibrator joining member 446 is fixed to the vibrator holding member 445 with a screw as the fixing member 447. The vibrator joining member 446 joins the vibrator 441 and the vibrator holding member 445.

Herein the vibrator joining member 446 is deformed easily in the direction to pressurize the vibrator 441 to the friction member 442, and therefore it does not inhibit the pressurizing force to pressurize the vibrator 441 to the friction member 442. Further, it is less deformed in the driving direction of the vibration wave motor 400, and therefore it can join the vibrator 441 and the vibrator holding member 445 without rattling in the driving direction of the vibration wave motor 400.

The pressurizing member 448 may be a compression spring, for example, which generates a pressurizing force to pressurize the vibrator 441 to the friction member 442 through its elastic deformation. Between the pressurizing member 448 and the vibrator 441, the pressurizing plate 449 is disposed. To the pressurizing plate 449, a piece of felt is attached as a buffering member 449a. The pressurizing plate 449 comes into contact with the vibrator 441 via the buffering member 449a, whereby a pressurizing force generated by the pressurizing member 448 can be transmitted to the vibrator 441 without inhibiting vibrations of the vibrator 441.

The rolling ball 450 is disposed between the groove 443a of the holding member 443 and the groove 445b of the vibrator holding member 445. With this configuration, the vibrator 441, the vibrator holding member 445, the pressurizing member 448 and the pressurizing plate 449 are held movable with reference to the friction member 442 and the holding member 443 in the driving direction D1 of the vibration wave motor 400 only.

In the above-stated configuration, when the vibrator 441 vibrates, the vibrator 441, the vibrator holding member 445, the pressurizing member 448 and the pressurizing plate 449 move in the driving direction D1 due to a frictional force generated between the vibrator 441 and the friction member 442. Note here that they may be configured so that the position of the vibrator 441 is fixed and a frictional force generated between the vibrator 441 and the friction member 442 may move the friction member 442 in the driving direction D1, and the lens holder 332 and the lens 331 may move in the optical axis direction OL along with the movement of the friction member 442.

The driving force transmission part 445a of the vibrator holding member 445 is joined to the groove 332b of the lens holder 332 that holds the lens 331, and therefore when the vibration wave motor 400 operates for driving, the lens 331 and the lens holder 332 can move forward and backward in the optical axis direction OL.

FIG. 10 is a cross-sectional view of an electronic apparatus (a lens barrel) incorporating such a lens-driving device 300 (vibration wave motor unit 1100). The following describes the lens barrel as an exchangeable lens 2000 that can be exchanged for a camera body 1000, and it may be a lens barrel that is integrally provided at the camera body 1000. Since the lens barrel has a substantially rotational symmetrical shape, the drawing shows the upper half only.

To the camera body 1000, the exchangeable lens 2000 is attached detachably, and an imaging element 1000a is disposed in the camera body 1000. A mount 1001 has a bayonet portion, at which the exchangeable lens 2000 is attached to the camera body 1000. A fixing barrel 1002 abuts a flange part of the mount 1001, and the mount 1001 is fixed by a screw not illustrated. To the fixing barrel 1002, a front barrel 1003 to hold a first group lens G1 and a rear barrel 1004 to hold a third group lens G3 are fixed. A focus-lens holding frame 1005 holds a focus lens (a second group lens) G2, and is held by a guide bar 1006 held at the front barrel 1003 and the rear barrel 1004 to be movable in a straight line. A ground plane 1101 in the vibration wave motor unit 1100 has a flange part (not illustrated), which is fixed to the rear barrel 1004 with a screw.

When the thus configured vibration wave motor unit 1100 operates for driving, the driving force of the vibration wave motor unit 1100 is transmitted to the focus-lens holding frame 1005 via a driving-force transmission unit 1103. The focus-lens holding frame 1005 moves in a straight line along the guide bar 1006. As described above, the piezoelectric body of each embodiment as stated above can improve both of the mechanical reliability and the electrical reliability of an electronic apparatus including such a piezoelectric body, and can be used for electronic apparatuses, such as an imaging apparatus and a lend barrel.

The present invention is applicable to a compact and light-weighted electronic apparatus requiring a wide driving-speed range, and is applicable especially to a lens-driving device 300 or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-110748, filed May 29, 2015, which is hereby incorporated by reference herein in its entirety.

What is claimed is:

1. A piezoelectric body, comprising:
   a piezoelectric element on which a plurality of first electrodes are disposed; and
   a flexible printed circuit substrate including a plurality of wiring layers extending over a base, a part of the wiring layers being covered with a coverlay, and at a part of the wiring layers that is not covered with the coverlay, a plurality of second electrodes being disposed, wherein
   the piezoelectric element and the flexible printed circuit substrate are bonded so that a part of the first electrodes and a part of the second electrodes are electrically connected and the piezoelectric element and a part of the coverlay overlap,
   the coverlay has an end made up of a first outline part and a second outline part that intersect with the wiring layers, the first outline part coming in contact with one electrode of the second electrodes, and the second outline part coming in contact with another electrode of the second electrodes,
   a length from an outer-shape line of the piezoelectric element that intersects with the flexible printed circuit substrate to the first outline part is shorter than a length from the outer-shape line to the second outline part, and the one of the second electrodes is located closer to the outer-shape line than the other electrode of the second electrodes.

2. The piezoelectric body according to claim 1, wherein an electrode of the first electrodes that is the closest to the outer-shape line is electrically connected to an electrode located on a rear face of the piezoelectric element via an electrode on a wall face of the piezoelectric element.

3. The piezoelectric body according to claim 1, wherein a part where the piezoelectric element and a part of the coverlay overlap has a dimension in a width direction that is larger than a dimension in the width direction of a part where the piezoelectric element and the flexible printed circuit substrate do not overlap.

4. The piezoelectric body according to claim 1, wherein the second outline part has an outline part that is dented toward the outer-shape line.

5. A vibration wave motor, comprising: a vibrator including: a piezoelectric body; and an elastic body,
   wherein the piezoelectric body includes:
   a piezoelectric element on which a plurality of first electrodes are disposed; and
   a flexible printed circuit substrate including a plurality of wiring layers extending over a base, a part of the wiring layers being covered with a coverlay, and at a part of the wiring layers that is not covered with the coverlay, a plurality of second electrodes being disposed, wherein
   the piezoelectric element and the flexible printed circuit substrate are bonded so that a part of the first electrodes and a part of the second electrodes are electrically connected and the piezoelectric element and a part of the coverlay overlap,
   the coverlay has an end made up of a first outline part and a second outline part that intersect with the wiring layers, the first outline part coming in contact with one electrode of the second electrodes, and the second outline part coming in contact with another electrode of the second electrodes,
   a length from an outer-shape line of the piezoelectric element that intersects with the flexible printed circuit substrate to the first outline part is shorter than a length from the outer-shape line to the second outline part, and
   the one of the second electrodes is located closer to the outer-shape line than the other electrode of the second electrodes.

6. The vibration wave motor according to claim 5, wherein the vibrator performs ultrasonic vibrations, the vibration wave motor is an ultrasonic motor.

7. An electronic apparatus, comprising a vibration wave motor including a vibrator including: a piezoelectric body; and an elastic body,
   wherein the piezoelectric body includes:
   a piezoelectric element on which a plurality of first electrodes are disposed; and
   a flexible printed circuit substrate including a plurality of wiring layers extending over a base, a part of the wiring layers being covered with a coverlay, and at a part of the wiring layers that is not covered with the coverlay, a plurality of second electrodes being disposed, wherein
   the piezoelectric element and the flexible printed circuit substrate are bonded so that a part of the first electrodes and a part of the second electrodes are electrically connected and the piezoelectric element and a part of the coverlay overlap, the coverlay has an end made up of a first outline part and a second outline part that intersect with the wiring layers, the first outline part coming in contact with one electrode of the second electrodes, and the second outline part coming in contact with another electrode of the second electrodes, a length from an outer-shape line of the piezoelectric element that intersects with the flexible printed circuit substrate to the first outline part is shorter than a length from the outer-shape line to the second outline part, and the one of the second electrodes is located closer to the outer-shape line than the other electrode of the second electrodes.

8. The electronic apparatus according to claim 7, wherein the electronic apparatus is an imaging apparatus.

9. The electronic apparatus according to claim 7, wherein the electronic apparatus is a lens barrel.

\* \* \* \* \*